United States Patent
Kitamura et al.

[11] Patent Number: 5,733,465
[45] Date of Patent: Mar. 31, 1998

[54] PROCESS FOR PRODUCING CUTTING DIE AND PRODUCED CUTTING DIE

[75] Inventors: Yoshihito Kitamura, Gojo; Yasuo Sumikawa, Urawa; Ryuichi Hayashi, Komae; Shigeo Ogawa, Oomiya, all of Japan

[73] Assignee: Lintec Corporation, Tokyo, Japan

[21] Appl. No.: 529,432

[22] Filed: Sep. 18, 1995

[30] Foreign Application Priority Data

Sep. 19, 1994 [JP] Japan .................................. 6-223541

[51] Int. Cl.⁶ .................................. B44C 1/22; C23F 1/00
[52] U.S. Cl. .................................. 216/11; 216/41; 216/52; 216/100
[58] Field of Search .................................. 216/11, 41, 47, 216/52, 100

[56] References Cited

U.S. PATENT DOCUMENTS

| 4,497,686 | 2/1985 | Weglin | 216/47 X |
| 4,579,022 | 4/1986 | Kasai et al. | 216/100 X |
| 4,579,634 | 4/1986 | Weglin | 216/47 X |
| 5,248,383 | 9/1993 | Hanada | 156/651 |

FOREIGN PATENT DOCUMENTS

| 0527616 | 2/1993 | European Pat. Off. |
| 0620201 | 10/1994 | European Pat. Off. |
| 203993 | 3/1923 | United Kingdom |
| 2066162 | 7/1981 | United Kingdom |

*Primary Examiner*—William Powell
*Attorney, Agent, or Firm*—Webb Ziesenheim Bruening Logsdon Orkin & Hanson, P.C.

[57] ABSTRACT

A cutting die is produced by a process of forming resist patterns corresponding to the shapes of low cutting edges and resist patterns corresponding to the shapes of high cutting edges on a metal plate and conducting an etching treatment on the metal plate, wherein the height of each of the cutting edges is varied by varying the width of the relevant resist pattern, varying the timing of removing the relevant resist pattern and applying or not applying sealing treatment thereto. This process enables easy production of a cutting die provided either with low cutting edges and high cutting edges or with embossing parts and high cutting edges. Further, the use of this cutting die enables simultaneous execution of full cutting and half cutting (or embossing) operations, so that labels, box development base papers and the like can be produced by a single process.

6 Claims, 6 Drawing Sheets

PROCESS FOR PRODUCING CUTTING DIE AND PRODUCED CUTTING DIE

FIELD OF THE INVENTION

The present invention relates to a process for producing a cutting die. More particularly, the present invention is concerned with a process for producing a cutting die for use in production of labels, box development base papers and the like and also with a cutting die which can be produced by this process.

BACKGROUND OF THE INVENTION

The technical background of the present invention will be described below with reference to the appended drawings.

Conventionally, cutting dies are used in the production of, for example, labels and box development base papers having respective desired shapes.

Referring to FIG. 5, for example, a label 10 is produced by two steps, namely, one step of applying a cutting die 15 having low cutting edges (half die cutting edges) to a base paper 14 composed of a substrate 11 and, laminated therewith, a pressure-sensitive adhesive layer 12 and a release paper 13 to thereby provide half die-cut parts of desired shape 17 (parts where cutting has been made in both the substrate and the pressure-sensitive adhesive layer but has not been made in the release paper) and the other step of effecting cutting of the base paper into a predetermined shape with a cutting die 16 having high cutting edges (full cutting edges).

Alternatively, the label 10 is produced by first performing the full cutting and then the half cutting. However, both processes have two steps, so that there has been the problem such that, when the feed of the base paper 14 does not synchronize the movements of the cutting dies 15, 16, the positions of the half cut parts and the full cut parts suffer from unfavorable shifts.

A single-step process for simultaneously forming half cut parts and full cut parts with the use of any of cutting dies equipped with both high blades and low blades has been proposed to cope with the above problem. However, such special cutting dies can be produced only by very difficult processes, so that they are very expensive. What is known as Thomson blade is one example of such cutting dies. The Thomson blade can be produced by first forming rents in a metal plate 4 and subsequently inserting thin blades 18, 19 of different heights in the rents as illustrated in FIG. 6. This process requires extremely high skills, so that the Thomson blade is expensive. Moreover, producing a cutting die equipped with blades having complex configuration by the above process has been very difficult.

Furthermore, it is known to produce a cutting die equipped with both high cutting edges and low cutting edges by a process of first forming a plurality of edges of the same heights on a metal plate according to the etching technique and subsequently grinding some of the edges by means of a grinder 20 to thereby obtain low cutting edges as shown in FIG. 7. However, this process also requires such high skills that industrial production is nearly impracticable.

The cutting die for use in the production of boxes and the like has the same problem. The box is produced by first cutting a base paper into box development shape, subsequently forming predetermined folds with the use of an embossing machine and thereafter folding the resultant box development base paper. Therefore, when the embossing machine does not synchronize with the cutting die, the folds suffer from unfavorable shifts, thereby rendering folding of the base paper into a box infeasible. This problem can be overcome by the use of a cutting die equipped with both cutting blades and embossing members. However, the production of this cutting die requires extremely high skills as in the above label.

OBJECT OF THE INVENTION

The present invention has been made with a view toward resolving the above problems. Thus, the object of the present invention is to provide a process for producing a cutting die which enables easy production of a cutting die equipped either with low cutting edges and high cutting edges or with embossing parts and high cutting edges and also to provide a cutting die produced thereby.

SUMMARY OF THE INVENTION

The present invention provides a process for producing a cutting die equipped either with low cutting edges and high cutting edges or with embossing parts and high cutting edges.

The process for producing a cutting die according to the first aspect of the present invention includes:

forming resist patterns of small width corresponding to the shapes of low cutting edges or embossing parts and resist patterns of large width corresponding to the shapes of high cutting edges on a metal plate;

conducting a first etching treatment on the metal plate having the resist patterns formed thereon;

removing the resist patterns; and conducting a finish etching treatment on the metal plate.

The process for producing a cutting die according to the second aspect of the present invention comprises:

forming resist patterns corresponding to the shapes of low cutting edges or embossing parts and resist patterns corresponding to the shapes of high cutting edges on a metal plate;

conducting a first etching treatment on the metal plate having the resist patterns formed thereon;

removing the resist patterns corresponding to the shapes of low cutting edges or embossing parts, conducting a second etching treatment on the metal plate having only the resist patterns corresponding to the shapes of high cutting edges retained thereon;

removing the resist patterns corresponding to the shapes of high cutting edges; and conducting a finish etching treatment on the metal plate.

The process for producing a cutting die according to the third aspect of the present invention includes:

forming resist patterns corresponding to the shapes of low cutting edges or embossing parts and resist patterns corresponding to the shapes of high cutting edges on a metal plate;

conducting a first etching treatment on the metal plate having the resist patterns formed thereon;

removing the resist patterns;

sealing the parts where the resist patterns corresponding to the shapes of high cutting edges have been formed with a sealer;

conducting a second etching treatment on the metal plate;

removing the sealer;

and conducting a finish etching treatment on the metal plate.

The cutting die of the present invention can be produced by any of the above first to third processes.

DETAILED DESCRIPTION OF THE INVENTION

The process for producing the cutting die according to the present invention will be illustrated below with reference to the appended drawings.

Figure 1:
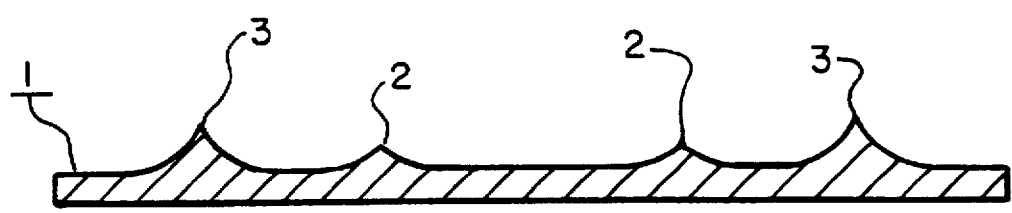
FIG. 1 is a sectional view of one form of cutting die obtained by the present invention.
Figure 2A:
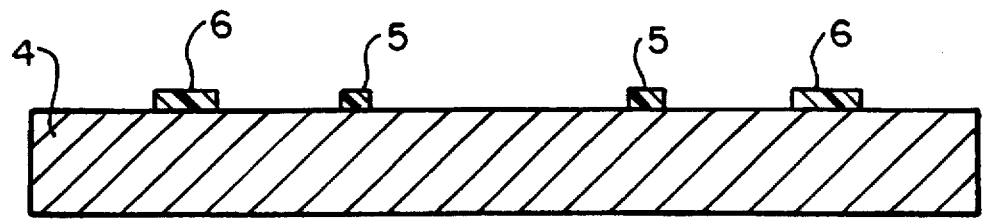
FIG. 2a–2d constitute a chart showing a process for producing a cutting die according to the first aspect of the present invention.
Figure 2B:
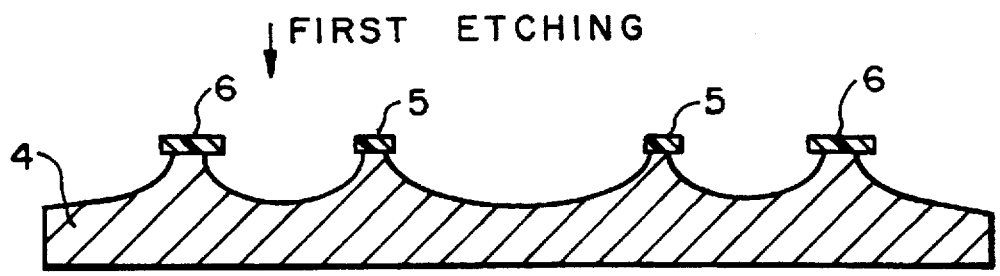
Figure 2C:
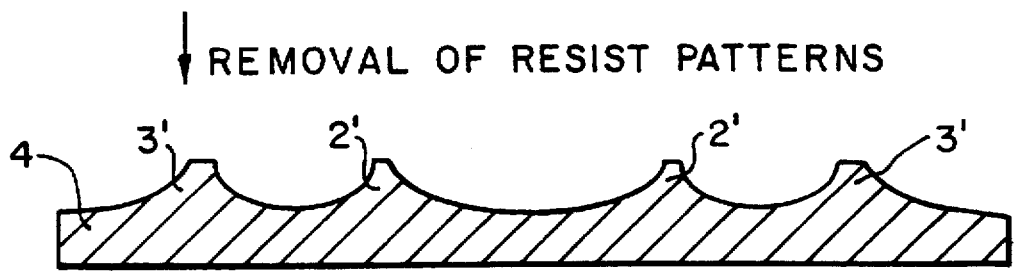
Figure 2D:
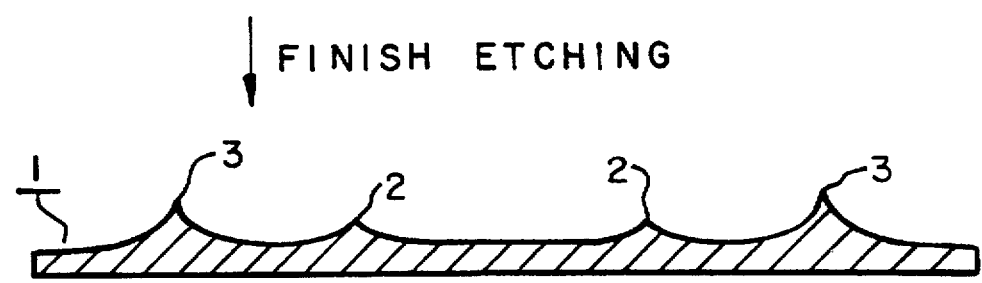
Figure 3A:
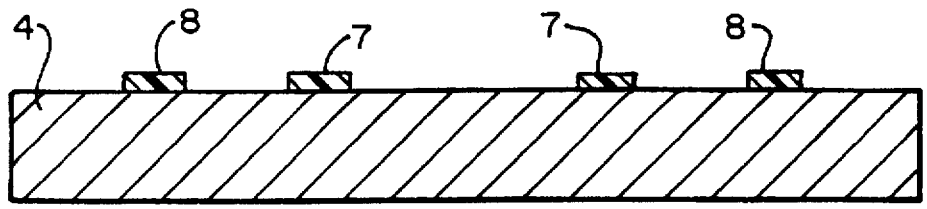
FIG. 3a–3d constitute is a chart showing a process for producing a cutting die according to the second aspect of the present invention.
Figure 3B:
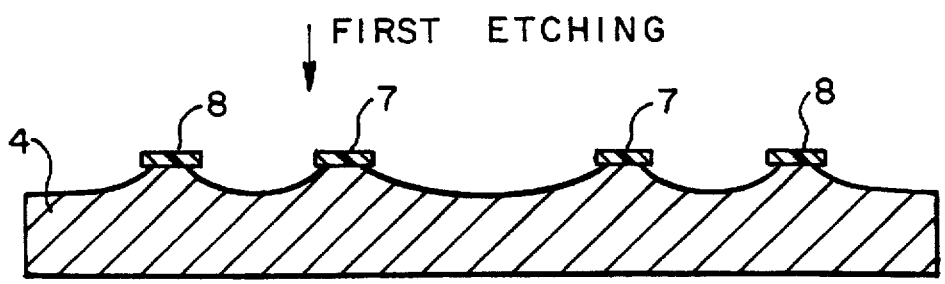
Figure 3C:
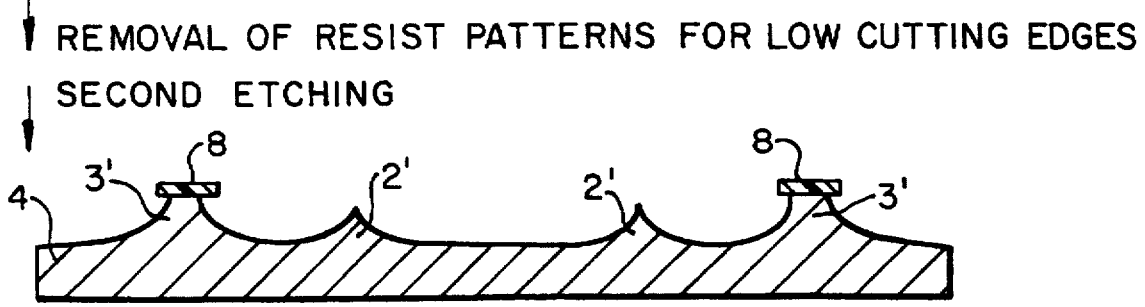
Figure 3D:
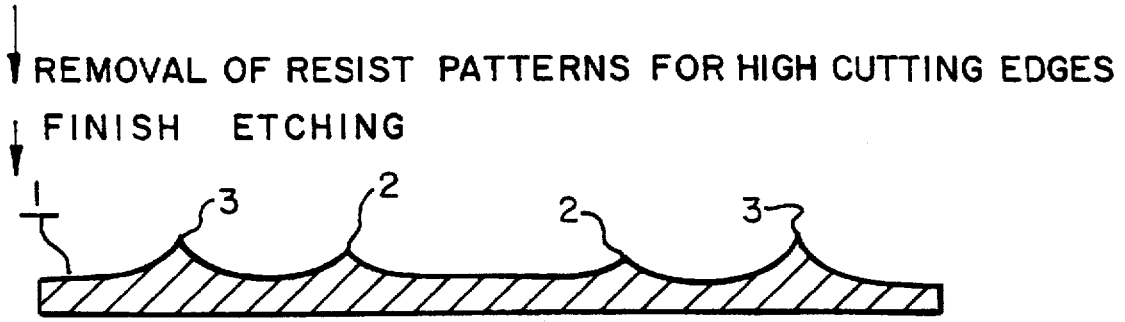
Figure 4A:
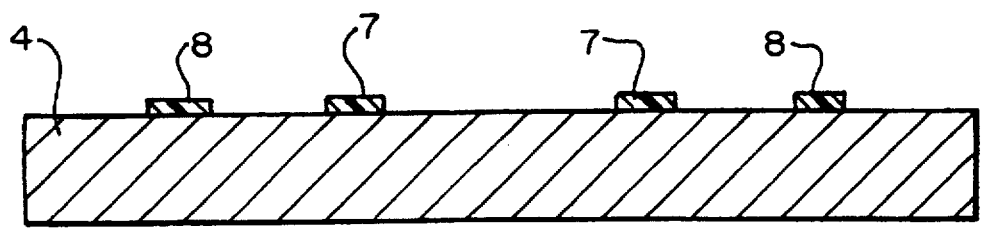
FIG. 4a–4e is a chart showing a process for producing a cutting die according to the third aspect of the present invention.
Figure 4B:
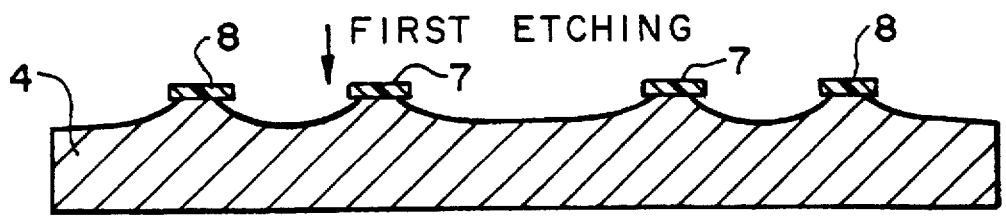
Figure 4C:
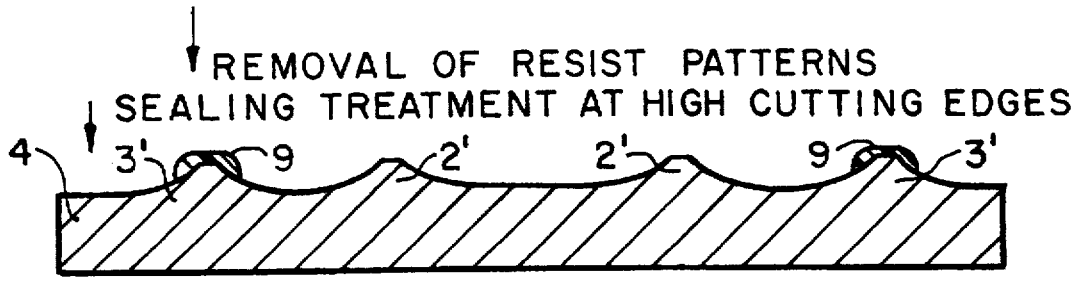
Figure 4D:
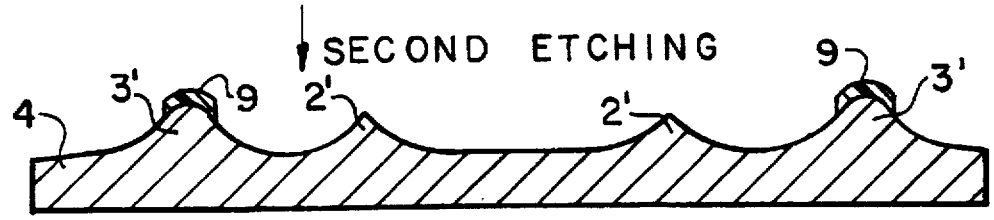
Figure 4E:
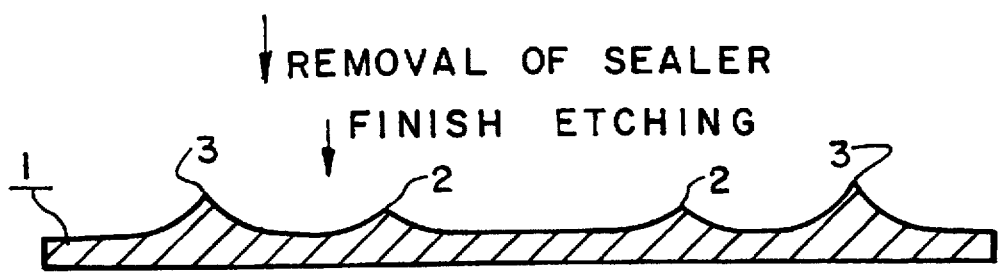
Figure 5A:
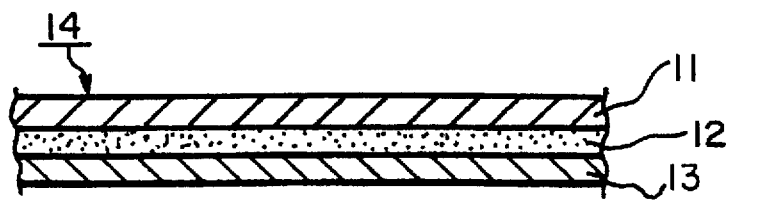
FIG. 5a–5e is a chart showing the conventional process for producing a label.
Figure 5B:
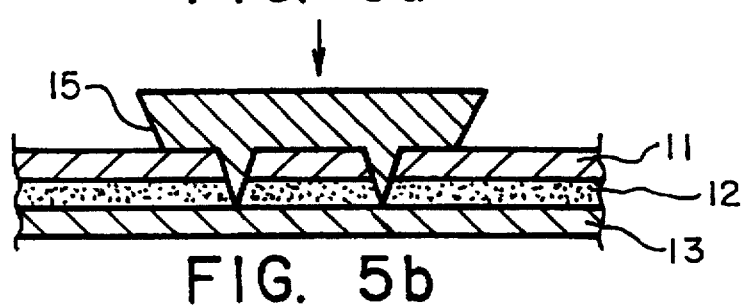
Figure 5C:
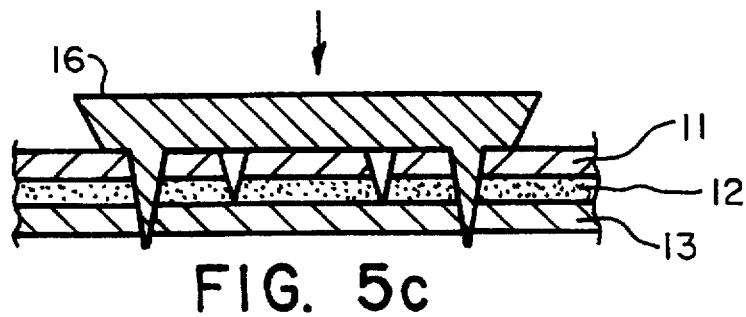
Figure 5D:
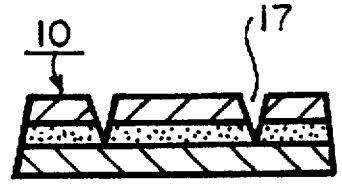
Figure 5E:
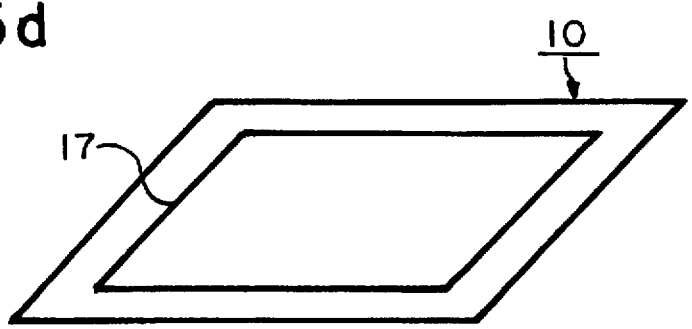
Figure 6:
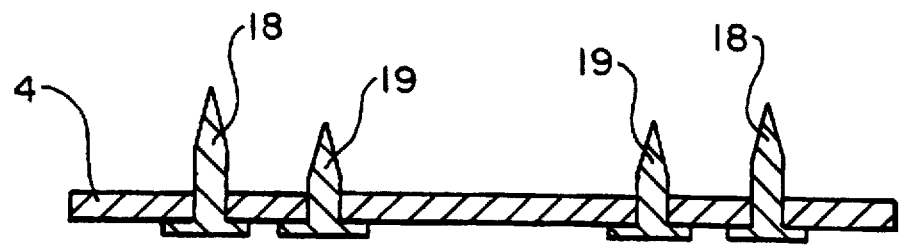
FIG. 6 is a sectional view of Thomson blade.
Figure 7:
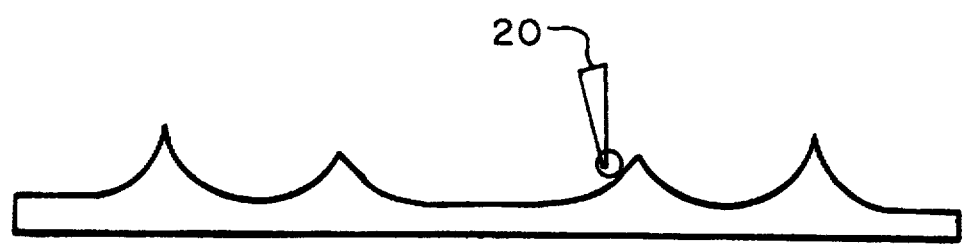
FIG. 7 shows the step of grinding some cutting edges of a cutting die fabricated by the etching technique with the use of a grinder to thereby form low cutting edges.

The object of the present invention is to produce a cutting die 1 having low cutting edges or embossing parts (hereinafter sometimes collectively referred to as "low cutting edges 2") and high cutting edges 3 as shown in FIG. 1.

The difference between the low cutting edges and the embossing parts resides in that, while the low cutting edges have sharp tips and hence possess cutting capability, the embossing parts have round tips and hence do not possess cutting capability. Low cutting edges having sharp edges are generally formed by the process described below. However, they are easily converted to the embossing parts by rounding the tips thereof, for example, by grinding the tips with the use of a file or the like. Therefore, the low cutting edges and the embossing parts will sometimes be collectively referred to as "low cutting edges 2" in the following description.

In the process for producing a cutting die according to the first aspect of the present invention, first, resist patterns 5 of small width corresponding to the shapes of low cutting edges 2 and resist patterns 6 of large width corresponding to the shapes of high cutting edges 3 are formed on a metal plate 4, as shown in FIG. 2. A steel plate such as a plate of carbon steel, stainless steel, refined steel or alloy steel is used without any particular limitation as the metal plate 4. Of the above metal plates, carbon steel and stainless steel plates are generally used. Although the thickness of the metal plate 4 is also not particularly limited, the metal plate 4 is desired to have an appropriate flexibility when the final cutting die is fitted over a roller in use thereof and is desired to have an appropriate stiffness when the final cutting die is used as a flat base cutter. In the use of the cutting die as a flat base cutter, reinforcement may be effected with another metal plate or a synthetic resin plate having appropriate stiffness.

The resist patterns 5, 6 can be formed on the metal plate 4 according to any of various conventional techniques. The respective widths of the resist patterns formed by multistage etching are determined as depending upon the respective heights of the relevant cutting edges of the final cutting die although they varied on the conditions such as the type of steel plate to be etched, the type, temperature and concentration (specific gravity) of the etchant and the etching time. That is, a required height (H) of each cutting edge of the cutting die and the width (W) of the corresponding resist pattern satisfy the relationship $0.7H \leq W \leq 1.8H$, preferably $H \leq W \leq 1.5H$.

In the etching step subsequent to the removal of the resist patterns, the phenomenon occurs such that the etching is advanced at a rate inversely proportional to the area of the width portion of the cutting edge, namely, rapidly where the area is small to thereby render the height of the cutting edge small. Thus, in the present invention, the smaller the width of the resist pattern, the smaller the height of the obtained cutting edge. Also, the greater the width of the resist pattern, the greater the height of the obtained cutting edge. Therefore, the width of each resist pattern 5 applied in order to form the low cutting edges 2 is smaller than that of each resist pattern 6 applied in order to form the high cutting edges 3.

Further description will be made with respect to, for example, pressure-sensitive adhesive labels. The height of each low cutting edge 2 is approximately equal to the sum of the thicknesses of the substrate 11 and the pressure-sensitive adhesive layer 12 in FIG. 5. On the other hand, the height of each high cutting edge 3 is approximately equal to the sum of the thicknesses of the substrate 11, the pressure-sensitive adhesive layer 12 and the release paper 13 in FIG. 5. Thus, the difference in height between the high cutting edge 3 and the low cutting edge 2 (height difference) to be set is approximately equal to the thickness of the release paper 13.

When the difference in height between the high cutting edge 3 and the low cutting edge 2 is set by a resist width, the desired height difference (h) and the corresponding set resist width difference (w) satisfy the relationship w=0.3 h to 0.7 h. For example, when the width ($W_1$) of the resist pattern of small width 5 is employed as a standard, the width ($W_2$) of the resist pattern of large width 6 is set so as to satisfy the relationship:

$$W_2 = W_1 + (0.3h \text{ to } 0.7h)$$

Alternatively, the above setting can be performed with the employment of the resist pattern of large width 6 as a standard.

The heights of the entire cutting edges and the resist pattern widths corresponding to the difference in height between the high cutting edge 3 and the low cutting edge 2 are set as described above.

Subsequently, etching treatment (the first etching step) is conducted on the metal plate 4 having the resist patterns 5, 6 formed thereon to thereby produce, where the resist patterns 5, 6 are provided, protrudent parts 2', 3' having predetermined heights, respectively. Any of various conventional etchants such as those of ferric chloride, hydrochloric acid, nitric acid and mixtures thereof can be used in this etching treatment. The etching time is generally in the range of 10 to 120 min although it depends on the type of the etchant employed. The protrudent parts 2', 3' formed by this etching treatment have the same heights.

The resist patterns 5, 6 are removed from the tops of the thus formed protrudent parts 2', 3', respectively with the use of a resist remover such as an alkali mixture solution.

Low cutting edges 2 are formed from the protrudent parts 2' and high cutting edges 3 from the protrudent parts 3' by conducting a finish etching treatment on the resultant metal plate 4. The same various conventional etchants as in the above first etching step can be used in this finish etching treatment. The etching time is generally in the range of 0.5 to 10 min although it depends on the type of the etchant employed.

Next, the process for producing a cutting die according to the second aspect of the present invention will be described with reference to FIG. 3.

In the process for producing a cutting die according to the second aspect of the present invention, first, resist patterns 7 corresponding to the shapes of low cutting edges 2 and resist patterns 8 corresponding to the shapes of high cutting edges 3 are formed on a metal plate 4. Although the width of each of the resist patterns 7, 8 is not particularly limited, it is generally in the range of about 100 to 700 μm, preferably about 200 to 400 μm. The width of each resist pattern 7 may be either identical with or different from the width of each resist pattern 8.

Subsequently, an etching treatment (first etching step) is conducted on the metal plate 4 having the resist patterns 7, 8 formed thereon. This first etching step is conducted under the same conditions as in the above first process.

Then, only the resist patterns 7 corresponding to the shapes of low cutting edges 2 are removed with the use of a resist remover. Thus, in this stage, only the resist patterns 8 corresponding to the shapes of high cutting edges 3 remain on the metal plate 4.

A further etching treatment (second etching step) is conducted on the resultant metal plate 4. The same various conventional etchants as in the above first etching step can be used in this second etching step. The etching time is generally in the range of 10 to 120 min although it depends on the type of the etchant employed. In this step, the etching advances at the parts corresponding to low cutting edges 2 to thereby form protrudent parts 2' having small heights. On the other hand, the parts corresponding to high cutting edges 3 are protected by the resist patterns 8, so that protrudent parts 3' having large heights are formed.

Thereafter, the resist patterns 8 are removed from the tops of the thus formed protrudent parts 3' with the use of a resist remover.

Low cutting edges 2 are formed from the protrudent parts 2' and high cutting edges 3 from the protrudent parts 3' by conducting a finish etching treatment on the resultant metal plate 4. This finish etching step is conducted under the same conditions as in the above first process.

Next, the process for producing a cutting die according to the third aspect of the present invention will be described with reference to FIG. 4.

In the process for producing a cutting die according to the third aspect of the present invention, first, resist patterns 7, 8 are formed on a metal plate 4 in the same manner as in the above second process, followed by a first etching step.

Subsequently, the resist patterns 7, 8 are both removed and sealing treatment is applied to only the parts where the resist patterns 8 have been formed, namely, the parts corresponding to the shapes of the high cutting edges 3. The sealing treatment is effected by applying a sealer 9. Various sealers 9 can be used without any particular limitation as long as they can be coated and are materials capable of forming films resistant to the etchants, which include, for example, varnishes, paints and photosensitive resists.

A further etching treatment (second etching step) is conducted on the resultant metal plate 4. The second etching step is conducted under the same conditions as in the above second process. In this step, the etching advances at the parts corresponding to low cutting edges 2 to thereby form protrudent parts 2' having small heights. On the other hand, the parts corresponding to high cutting edges 3 are sealed, so that protrudent parts 3' having large heights are formed.

Thereafter, the sealer 9 is removed from the tops of the thus formed protrudent parts 3' with the use of a solvent or a resist remover.

Low cutting edges 2 are formed from the protrudent parts 2' and high cutting edges 3 from the protrudent parts 3' by conducting a finish etching treatment on the resultant metal plate 4. This finish etching step is conducted under the same conditions as in the above first process.

The cutting die of the present invention can be produced by any of the above first to third processes and has low cutting edges 2 and high cutting edges 3 formed by the etching technique.

The production of a cutting die for use in cutting of a box development base paper or the like according to the present invention can be accomplished by rounding the tips of the low cutting edges 2 with the use of a file or the like to thereby obtain embossing parts after the completion of the above steps.

In the present invention, the low cutting edges 2 and the high cutting edges 3 may be provided either in a continuous form or in the form of sewing-machine-made perforations or broken lines. The construction of the low cutting edges 2 and high cutting edges 3 in the form of sewing-machine-made perforations or broken lines can be achieved by applying the resist patterns 5, 6 or 7, 8 in the form of sewing-machine-made perforations or broken lines.

EFFECT OF THE INVENTION

The process for producing a cutting die according to the present invention enables easy production of a cutting die equipped either with low cutting edges and high cutting edges or with embossing parts and high cutting edges. The use of this cutting die enables simultaneous execution of full cutting and half cutting (or embossing), so that labels, box development base papers and the like can be produced by a single step.

EXAMPLE

The present invention will now be illustrated with reference to the following Examples, which in no way limit the scope of the invention. In the following Examples, the employed metal plate, etching machine and etchant were as follows:

metal plate: carbon steel plate (SK steel of 0.45 mm in thickness produced by Nisshin Steel Co., Ltd.), etching machine: LT-300 (trade name; produced by Takano Machinery Works Co., Ltd.), and etchant: ferric chloride solution.

The etching was conducted at a solution temperature of 40° C. and at a spray pressure of 1.5 to 0.3 kg/cm$^2$.

Example 1

A photosensitive resist was applied onto a carbon steel plate, thereby forming resist patterns each having a width as small as 300 μm and resist patterns each having a width as large as 328 μm. A first etching was conducted on the carbon steel plate with an etchant (specific gravity: 46 Be' (Baume')) at a spray pressure of 1.2 kg/cm$^2$ for 17 min. Subsequently, the resist patterns of small width and the resist patterns of large width were removed with the use of a resist remover (Remover (trade name) produced by Koyo Chemicals Inc.).

As a result, protrudent parts each having a top width of 100 µm were formed from the resist patterns of small width and protrudent parts each having a top width of 140 µm were formed from the resist patterns of large width. Thereafter, a finish etching (spray pressure: 0.5 kg/cm$^2$) was conducted for 3 min. Thus, there was obtained a cutting die having low cutting edges of 220 µm in cutting edge height and 5 µm in width of cutting edge tip and high cutting edges of 290 µm in cutting edge height and 10 µm in width of cutting edge tip.

Example 2

A photosensitive resist was applied onto a carbon steel plate, thereby forming two kinds of resist patterns 300 µm in width (one referred to as "resist patterns for low cutting edges" and the other referred to as "resist patterns for high cutting edges" hereinafter). A first etching was conducted on the carbon steel plate with an etchant (specific gravity: 48 Be') at a spray pressure of 1.2 kg/cm$^2$ for 16 min. Subsequently, the resist patterns for low cutting edges were removed with the use of the same resist remover as in Example 1. As a result, protrudent parts each having a top width of 130 µm were formed from the resist patterns for low cutting edges. Then, a second etching was conducted at a spray pressure of 1.2 kg/cm$^2$ for 2 min. As a result, protrudent parts each having a top width of 80 µm and protrudent parts each having a top width of 100 µm were formed. Thereafter, the resist patterns for high cutting edges were removed and a finish etching (spray pressure: 0.5 kg/cm$^2$) was conducted for 50 sec. Thus, there was obtained a cutting die having low cutting edges of 210 µm in cutting edge height and 5 µm in width of cutting edge tip and high cutting edges of 270 µm in cutting edge height and 15 µm in width of cutting edge tip.

Example 3

A photosensitive resist was applied onto a carbon steel plate, thereby forming two kinds of resist patterns of 300 µm in width (one referred to as "resist patterns for low cutting edges" and the other referred to as "resist patterns for high cutting edges" hereinafter). A first etching was conducted on the carbon steel plate with an etchant (specific gravity: 49.5 Be') at a spray pressure of 1.2 kg/cm$^2$ for 19 min. Subsequently, the resist patterns for low cutting edges and the resist patterns for high cutting edges were removed with the use of the same resist remover as in Example 1. As a result, two kinds of protrudent parts each having a top width of 140 µm were formed. Then, an acid-proof varnish (produced by Taiyo Insatsu Kabushiki Kaisha) was applied to the protrudent parts formed from the resist patterns for high cutting edges and dried to thereby effect sealing treatment. Thereafter, a second etching was conducted at a spray pressure of 1.2 kg/cm$^2$ for 2 min. The acid-proof varnish was removed with acetone. A finish etching (spray pressure: 0.5 kg/cm$^2$) was conducted for 2.5 min. Thus, there was obtained a cutting die having low cutting edges of 230 µm in cutting edge height and 10 µm in width of cutting edge tip and high cutting edges of 270 µm in cutting edge height and 15 µm in width of cutting edge tip.

What is claimed is:

1. A process for producing a cutting die having low cutting edges or embossing parts and high cutting edges which comprises:

forming resist patterns of small width corresponding to the shapes of low cutting edges or embossing parts and resist patterns of large width corresponding to the shapes of high cutting edges on a metal plate, conducting a first etching treatment on the metal plate having the resist patterns formed thereon, removing the resist patterns, and conducting a finish etching treatment on the metal plate.

2. A process for producing a cutting die having low cutting edges or embossing parts and high cutting edges which comprises:

forming resist patterns corresponding to the shapes of low cutting edges or embossing parts and resist patterns corresponding to the shapes of high cutting edges on a metal plate, conducting a first etching treatment on the metal plate having the resist patterns formed thereon, removing the resist patterns corresponding to the shapes of low cutting edges or embossing parts, conducting a second etching treatment on the metal plate having only the resist patterns corresponding to the shapes of high cutting edges retained thereon, removing the resist patterns corresponding to the shapes of high cutting edges, and conducting a finish etching treatment on the metal plate.

3. A process for producing a cutting die having low cutting edges or embossing parts and high cutting edges which comprises:

forming resist patterns corresponding to the shapes of low cutting edges or embossing parts and resist patterns corresponding to the shapes of high cutting edges on a metal plate, conducting a first etching treatment on the metal plate having the resist patterns formed thereon, removing the resist patterns, sealing the parts where the resist patterns corresponding to the shapes of high cutting edges have been formed with a sealer, conducting a second etching treatment on the metal plate, removing the sealer, and conducting a finish etching treatment on the metal plate.

4. A cutting die produced by the process comprising:

forming resist patterns of small width corresponding to the shapes of low cutting edges or embossing parts and resist patterns of large width corresponding to the shapes of high cutting edges on a metal plate, conducting a first etching treatment on the metal plate having the resist patterns formed thereon, removing the resist patterns, and conducting a finish etching treatment on the metal plate.

5. A cutting die produced by the process comprising:

forming resist patterns corresponding to the shapes of low cutting edges or embossing parts and resist patterns corresponding to the shapes of high cutting edges on the metal plate, conducting a first etching treatment on the metal plate having the resist patterns formed thereon, removing the resist patterns corresponding to the shapes of low cutting edges or embossing parts, conducting a second etching treatment on the metal plate having only the resist patterns corresponding to the shapes of high cutting edges retained thereon, removing the resist patterns corresponding to the shapes of high cutting edges, and conducting a finish etching treatment on the metal plate.

6. A cutting die produced by the process comprising:

forming resist patterns corresponding to the shapes of low cutting edges or embossing parts and resist patterns corresponding to the shapes of high cutting edges on a metal plate, conducting a first etching treatment on the metal plate having the resist patterns formed thereon, removing the resist patterns, sealing the parts where the resist patterns corresponding to the shapes of high cutting edges have been formed with a sealer, conducting a second etching treatment on the metal plate, removing the sealer, and conducting a finish etching treatment on the metal plate.

* * * * *

UNITED STATES PATENT AND TRADEMARK OFFICE
CERTIFICATE OF CORRECTION

PATENT NO. : 5,733,465
DATED : March 31, 1998
INVENTOR(S) : Yoshihito Kitamura et al.

It is certified that error appears in the above-identified patent and that said Letters Patent is hereby corrected as shown below:

Column 2 Line 35 "comprises" should read --includes--.

Column 2 Line 43 after "parts" delete comma and insert semicolon --;--.

Column 3 Line 8 "Fig. 2a-2d" should read --Figs. 2a-2d--.

Column 3 Line 11 "Fig. 3a-3d constitute is" should read --Figs. 3a-3d constitute--.

Column 3 Line 14 "Fig. 4a-4e is" should read --Figs. 4a-4e constitute--.

Column 3 Line 17 "Fig. 5a-5e is" should read --Figs. 5a-5e constitute--.

Signed and Sealed this

Twenty-eighth Day of July, 1998

Attest:

BRUCE LEHMAN

*Attesting Officer*  *Commissioner of Patents and Trademarks*